United States Patent
Bernard et al.

(10) Patent No.: US 11,061,078 B2
(45) Date of Patent: Jul. 13, 2021

(54) DIFFERENTIAL PROTECTION TEST METHOD, DIFFERENTIAL PROTECTION DEVICE AND ELECTRICAL UNIT INCLUDING SUCH A DEVICE

(71) Applicant: Schneider Electric Industries SAS, Rueil Malmaison (FR)

(72) Inventors: Jean-Baptiste Bernard, Seyssinet-Pariset (FR); Francois Vincent, Le Cheylas (FR); Simon Tian, Eybens (FR); Jerome Meunier-Carus, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 303 days.

(21) Appl. No.: 16/190,241

(22) Filed: Nov. 14, 2018

(65) Prior Publication Data

US 2019/0190247 A1 Jun. 20, 2019

(30) Foreign Application Priority Data

Dec. 19, 2017 (FR) ..................................... 17 62429

(51) Int. Cl.
*G01R 31/50* (2020.01)
*G01R 31/327* (2006.01)
*H02H 3/08* (2006.01)
*G01R 35/00* (2006.01)
*H02H 3/33* (2006.01)
(Continued)

(52) U.S. Cl.
CPC ......... *G01R 31/50* (2020.01); *G01R 31/3278* (2013.01); *G01R 31/52* (2020.01); *G01R 35/00* (2013.01); *H02H 3/044* (2013.01); *H02H 3/05* (2013.01); *H02H 3/083* (2013.01);
(Continued)

(58) Field of Classification Search
CPC .. G01R 31/50; G01R 31/3278; G01R 31/327; G01R 31/333; H02H 3/083; H02H 3/044; H02H 3/05; H02H 3/33; H02H 3/334; H02H 3/335
USPC ......... 361/42, 44, 45, 91.2, 93.5, 93.6, 93.9, 361/101, 102
See application file for complete search history.

(56) References Cited

U.S. PATENT DOCUMENTS

2012/0249151 A1 10/2012 Dobusch et al.

FOREIGN PATENT DOCUMENTS

WO WO 2012/040750 A1 4/2012

OTHER PUBLICATIONS

French Preliminary Search Report dated Sep. 14, 2018 in French Application 17 62429, filed on Dec. 19, 2017 (with English Translation of Categories of Cited Documents & Written Opinion).

*Primary Examiner* — Nguyen Tran
(74) *Attorney, Agent, or Firm* — Oblon, McClelland, Maier & Neustadt, L.L.P.

(57) ABSTRACT

A method that tests a differential protection device having a first and a second differential protection chain includes: a step of controlling the flow of a test signal for a duration smaller than a no-trip time, and steps of determining the state of the two differential protection chains after the flow of a test signal, of monitoring the conformity of the evolution of the protection chains, and of determining the state of the test. The differential protection device includes two differential protection chains and controls the flow of a test current for a duration smaller than a no-trip time. It includes modules for monitoring the evolution of the protection chains and determining the state of the test in order to control the opening of an electrical unit if the test is good. The device can be included in the electrical unit.

16 Claims, 5 Drawing Sheets

(51) Int. Cl.
   *H02H 3/04* (2006.01)
   *H02H 3/05* (2006.01)
   *G01R 31/52* (2020.01)
(52) U.S. Cl.
   CPC .............. *H02H 3/33* (2013.01); *H02H 3/334* (2013.01); *H02H 3/335* (2013.01)

DIFFERENTIAL PROTECTION TEST METHOD, DIFFERENTIAL PROTECTION DEVICE AND ELECTRICAL UNIT INCLUDING SUCH A DEVICE

TECHNICAL FIELD

The invention relates to a method for testing differential protection having a first differential protection chain, a second differential protection chain and a processing unit.

The invention also relates to a differential protection device including:
- a first differential protection chain,
- a second differential protection chain,
- a test device for testing said differential protection chains, and
- a processing unit connected to the second differential protection chain.

The invention also relates to an electrical protection unit including main contacts, a mechanism for opening said main contacts, main conductors connected in series with said main contacts and a differential protection device having at least two differential protection chains.

PRIOR ART

It is known to use the injection of signals to test differential protection devices. The aim of these tests is to check the operation of the measurement and tripping chain.

The majority of the tests consist in generating a differential fault signal and in noting the tripping or the opening of an electrical unit.

Known test devices are not sufficient for testing complex differential protection devices having a plurality of differential protection chains. These complex devices often include a first protection chain with its own current, without the requirement for an external electric power supply, and a second more comprehensive chain formed of electronic circuits requiring an electric power supply. Generally, the first chain detects AC or pulsed current faults, and the second chain makes it possible to detect DC, AC or pulsed current faults.

Conventional test circuits inject or channel a differential fault current or signal in measurement tori. The processing chains then detect the fault and bring about tripping of the opening of an electrical unit, such as a switch or a circuit breaker. In this case, during the test, it is enough for just one protection chain to operate in order to cause tripping. Therefore, the test is not comprehensive and does not reflect the full correct operation of all of the differential protection chains.

DISCLOSURE OF THE INVENTION

The aim of the invention is a test method and a differential protection device having improved testing of the differential protection chains.

According to the invention, a method for testing differential protection having a first differential protection chain, a second differential protection chain and a processing unit includes:
- a step of controlling the flow or the injection of a signal for testing the differential protection for a predetermined duration smaller than a no-trip time of said first and of said second differential protection chains,
- steps of determining a state of said first and of said second differential protection chain after the flow of a test signal, of monitoring the conformity of the evolution of the protection chains, and of determining the state of the test, and
- a step of tripping or of signalling if the test is satisfactory.

Advantageously, the method includes, during a test phase:
- a step of determining the state of said first and of said second differential protection chain before the flow of a test signal, and
- a step of calculating the duration of injection of the test current on the basis of the result of the determination of the state of said differential protection chains.

Preferably, said second differential protection chain requiring an electric power supply is associated with the processing unit, and the method includes, during the test phase, a step of preventing or of selecting long tripping of the second differential protection chain before the command to channel or to inject of said test signal.

Preferably, in steps of determining the state of said first differential processing chain, the method monitors a timing or filtering component of said first differential protection chain not requiring an electric power supply.

Advantageously, the method includes a step of detecting action on a unit for controlling the test, in order to manually launch a test cycle and/or steps for automatically launching said test cycle periodically.

Preferably, the method includes a step of reinitializing a digital part of the processing unit if the state of the test is not compliant.

According to the invention, in a differential protection device including:
- a first differential protection chain,
- a second differential protection chain,
- a test device for testing said differential protection chains, and
- a processing unit connected to modules of the second differential protection chain in order to receive a signal representative of the processing of said second chain, said processing unit:
- is also connected to the first differential protection chain in order to receive a signal representative of the differential protection and in order to determine the state of the protection of said first chain,
- includes an output for controlling the flow of a test current or signal for a predetermined duration smaller than a no-trip time of said first and of said second differential protection chains,
- includes modules for monitoring the evolution of the protection chains and determines the state of the test, and
- controls tripping of the opening of an electrical unit or signalling if the test is good.

Advantageously, the processing unit includes modules for determining the state of said first differential protection chain and of said second differential protection chain before the flow of a test current or signal, and for controlling the test device on the basis of the state of the first and of the second differential protection chain.

Advantageously, the first differential protection chain is a chain operating with AC or pulsed fault current not requiring an electric power supply for its own operation.

Advantageously, the second differential protection chain operates for DC, AC or pulsed fault currents and is supplied with power by an electric power supply, said processing unit being associated with said second differential protection chain in order to process the differential protection.

Preferably, the first differential protection chain includes a timing or filtering component, said component being connected to the processing unit in order to supply a signal representative of the state of the first differential protection chain.

Preferably, the differential protection device includes a unit for controlling the test that is connected to the processing unit in order to manually control a test cycle.

Advantageously, the opening of a unit is tripped by a command for a test current flow time that is greater than a trip time of the first protection chain or of the second protection chain.

Advantageously, the opening of a unit is tripped by a direct command from a trip relay via said processing unit or via an output of the processing unit controlling the charging of a capacitor also used to store electrical energy for controlling said trip relay.

According to the invention, in an electrical protection unit including main contacts, a mechanism for opening said main contacts, main conductors connected in series with said main contacts and a differential protection device having at least two differential protection chains, said differential protection device is a device as defined above including current sensors for said differential protection chains surrounding said main conductors and supplying signals representative of differential fault currents, said opening mechanism being actuated by a trip relay in the event of detection of a differential fault or of a conclusive test of said differential protection chains.

BRIEF DESCRIPTION OF THE DRAWINGS

Other advantages and features will become more clearly apparent from the following description of particular embodiments of the invention, which are given by way of non-limiting example and shown in the appended drawings, in which.

DETAILED DESCRIPTION OF EMBODIMENTS

Figure 1:
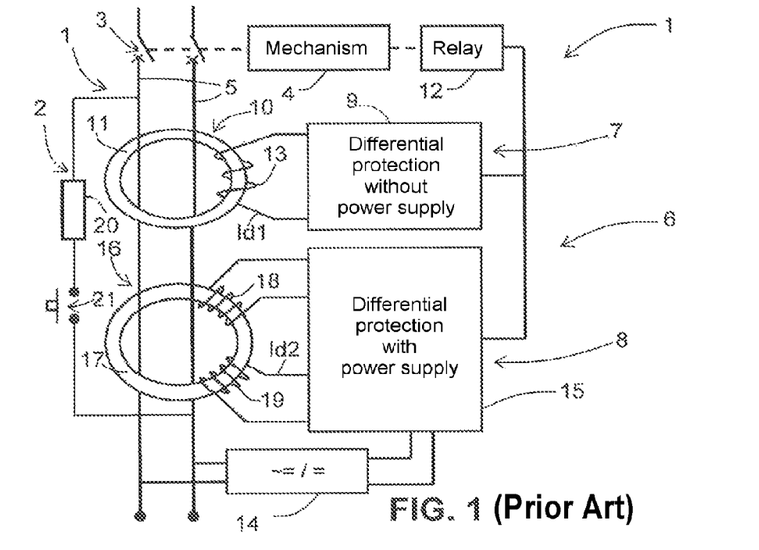
FIG. 1 shows a block diagram of an electrical unit including a differential protection device according to the prior art.

FIG. 1 shows a block diagram of an electrical unit 1 including a test device 2 for testing a differential protection device according to one known embodiment. Said electrical protection unit includes main contacts 3, a mechanism 4 for opening said main contacts 3, main conductors 5 connected in series with said main contacts and a differential protection device 6 having at least two differential protection chains. A first differential protection chain 7 with its own current does not require an external electric power supply, and a second differential protection chain 8 has an electric power supply. The first chain 7 includes a first electronic processing module 9 connected to a first measurement sensor 10, such as a transformer or a measurement torus with a magnetic circuit 11. Said transformer or torus 10 supplies a measurement current or signal Id1 on a secondary winding 13 that is representative of a differential current Id flowing in the main conductor lines 5. The measurement sensor 10 surrounds all of the main conductors 5 and supplies a measurement current Id1 for the differential protection as an AC or pulsed current. The measurement current Id1 supplied by the torus is enough to make the first protection module 9 operate and to actuate the trip relay 12. The second differential protection chain 8 requires an electric power supply 14. This power supply 14 is generally connected to lines of the main conductors 5 and includes a voltage converter for supplying power to the electronic processing circuits. The second chain 8 includes a second electronic processing module 15 connected to a second measurement sensor 16. The sensor 16 is generally a complex sensor with a magnetic circuit 17 including an excitation winding 18 and a measurement winding 19 supplying a second measurement signal Id2. The measurement sensor 16 also surrounds all of the main conductors 5 and supplies a measurement current Id2 for the differential protection of all types of currents, be these DC, AC or pulsed. The second processing circuit also actuates the trip relay 12 in the event of a differential fault.

The protection chains are conventionally tested by generating a differential current upstream and downstream of the current sensors 10 and 16. The test device 2 includes a resistor 20 for limiting the test current and a test pushbutton 21 that are connected in series between an upstream first line conductor and a downstream second line conductor. When the test is controlled by acting on the pushbutton, a fault current is generated and the most affected or fastest processing chain controls tripping of the relay 12 and the opening of the contacts 3 by way of the mechanism 4. The two protection chains are thus not tested in one and the same test.

Figure 2:
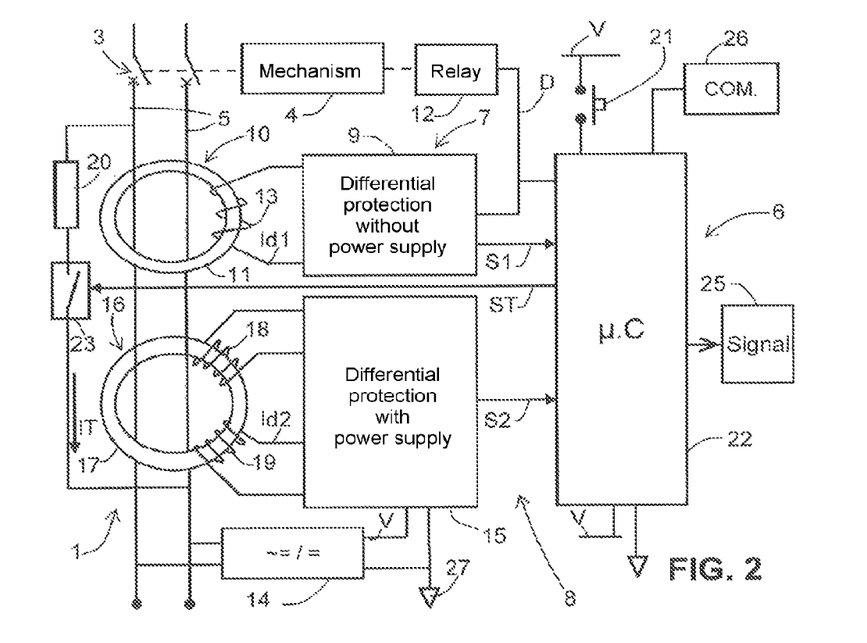
FIG. 2 shows a block diagram of an electrical unit including a differential protection device according to a first embodiment of the invention.

A differential protection device according to the invention includes a test of the differential protection functions that makes it possible to test at least two differential protection chains in one and the same test. FIG. 2 shows a block diagram of a bipolar electrical unit with two main lines and including a differential protection device according to a first embodiment of the invention. The differential protection device 6 includes a first differential protection chain 7, a second differential protection chain 8, a test device 2 for testing the differential protection chains, and a processing unit 22 connected to the second differential protection chain 8.

In this embodiment, the processing unit is also connected to the first differential protection chain 7 in order to determine the state of the protection. Thus, the processing unit 22 includes an input for receiving a signal S1, supplied by a first processing module 9 and representative of the state of the protection of the first protection chain. A second signal S2 representative of the operation of the second chain 7 is supplied to the processing unit by a second module 15. The processing unit 22 has an output supplying a signal ST for controlling the flow of a test signal IT for a predetermined duration T1 smaller than a no-trip time TND of said first and of said second differential protection chains. The processing unit includes modules for monitoring the evolution of the protection chains, determining the state of the test and controlling tripping of the opening of an electrical unit if the test is good. The test circuit includes a switch 23 controlled by the test signal ST in order to channel the differential fault current detected by the current sensors of the two protection chains. The device of FIG. 2 includes a unit 21 for controlling the test that is connected to the processing unit 22 in order to manually control a test cycle.

The processing unit includes modules for determining the state of said first differential protection chain 7 and of said second differential protection chain 8 before the flow of a test signal IT, and for controlling the test device on the basis of the state of the first and of the second differential protection chain. After or during the flow of the test current, the modules of the processing unit monitor the evolution of the two protection chains. Then, if the evolutions of the two chains are compliant, they signal or control tripping of the opening of a unit. Otherwise, a signalling output connected to an indicator 25 signals a defective test. A communication circuit 26 connected to the processing unit may also signal the operating state of the test.

Preferably, tripping is achieved by a command for a test current IT flow time T4 that is greater than a trip time TD of the first processing chain and/or of the second processing chain. Another way of controlling tripping is to directly control the relay 12 via an output of the processing unit. In FIG. 2, the relay is controlled by a signal D directly via the first processing chain or via an output of the processing unit. In this case, the second differential protection chain is also processed by digital modules that are integrated into the processing unit 22.

In this embodiment, the first differential protection chain 7 is a chain said to have its own current operating with AC or pulsed fault current and not requiring an electric power supply for its operation. The second differential protection chain 8 operates for DC, AC or pulsed fault currents and is supplied with power by an electric power supply 14. Said processing unit 22 is preferably associated with the second differential protection chain in order to process the differential protection. The power supply 14 supplies the energy necessary to make the second processing chain and the processing unit operate. It includes a reference voltage output 27 and at least one supply voltage line output V for supplying power to the circuits.

Figure 3:
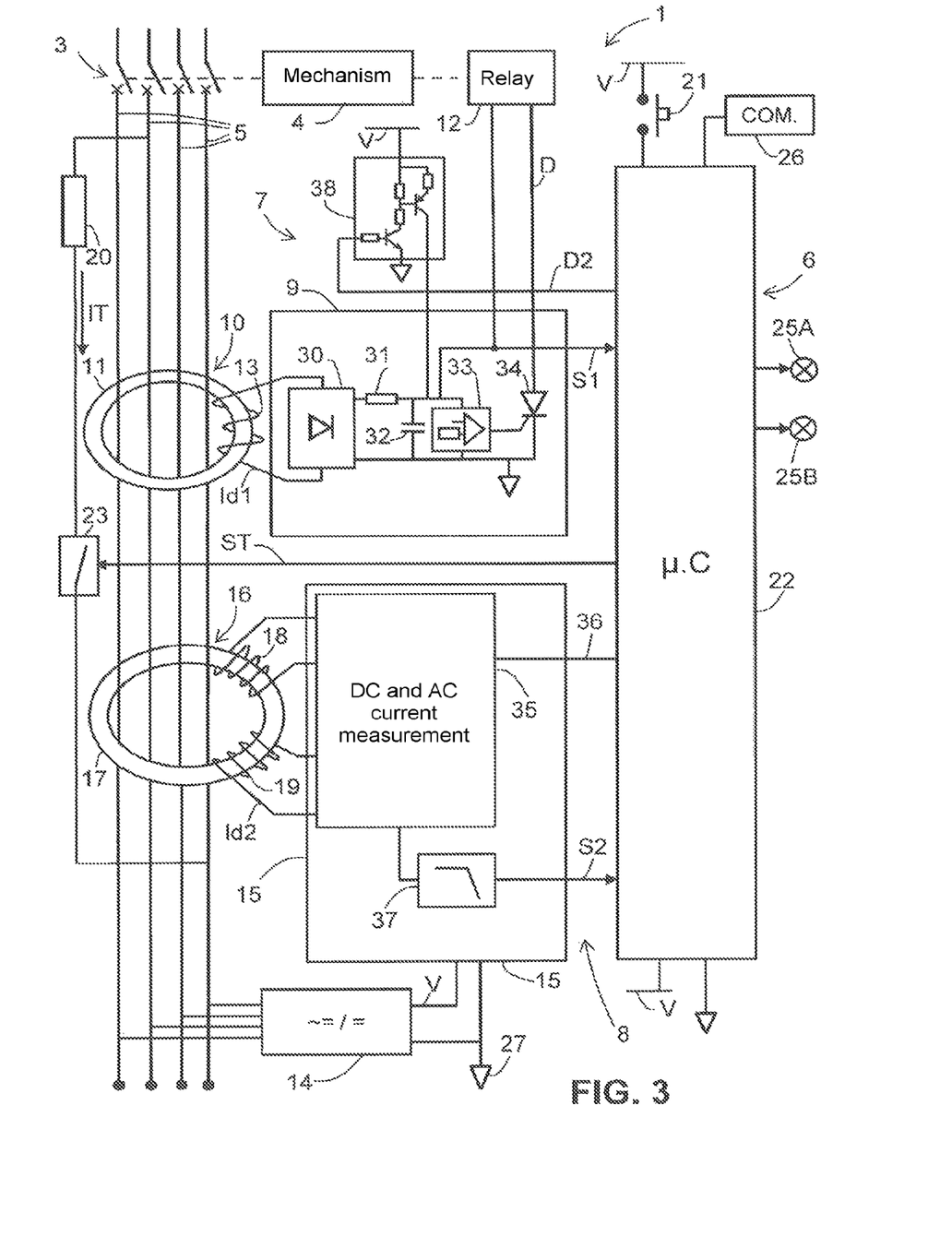
FIG. 3 shows a block diagram of an electrical unit including a differential protection device according to a second embodiment of the invention.

FIG. 3 shows a block diagram of a tetrapolar electrical unit with four line conductors and including a differential protection device according to a second embodiment of the invention. The first differential protection chain 7 includes, in the module 9, a rectifier 30 connected to the secondary winding 13 of the first sensor 10, a resistor 31 connected at the output of the rectifier, and a capacitor 32 connected to the resistor 31 and to the rectifier. The resistor 31 and capacitor 32 circuit performs timing for the tripping of the first processing chain. The capacitor is also connected to a voltage threshold comparator 33 in order to control a thyristor 34 or a transistor for controlling the trip relay 12. The electrical energy accumulated in the capacitor 32 is used to control and supply power to the trip relay of the first processing chain, without requiring an additional power supply. The measurement signal from the first sensor alone is enough to charge the capacitor 32 acting as a timer and as an energy store. The capacitor 32, by virtue of its timing or filtering function, has a voltage representative of the differential protection of the first chain. The capacitor 32 is advantageously connected to the processing unit in order to supply the signal S1 representative of the state of the first differential protection chain. Thus, the timing or filtering component 32 is a capacitor also used to store electrical energy for controlling the trip relay.

The second processing chain 8 includes, in its module 15, a current measurement circuit capable of measuring DC, AC or pulsed differential fault currents, for example currents having a frequency ranging from 0 Hz to several kHz. This circuit 35 sends excitation signals to a winding 18 of the second sensor and measures a current value on a second winding 19. The operating frequency of the circuit 35 is monitored by a connection 36 to the processing unit. The measurement signal of the second processing chain is filtered by a low-pass filter 37 and then supplied by the signal S2 to the processing unit.

The processing unit controls the flow of a test current or signal for a no-trip TND time T1, and then it determines the operating state of the two processing chains and determines the state of the test. If the test is good, tripping is controlled, and otherwise there is signalling of a defective test representative of a chain not responding to the test in the expected manner. At the end of the test, a first indicator light 25A connected to the processing unit signals a test fault, and a second indicator light 25B signals a compliant or good test. In a more complex device, a measurement of a previous differential fault current or the previous state of the state of the protection chains makes it possible to determine the time to generate the test signal, which time will be smaller than the trip time. A fault before a test could reduce the no-trip time. Likewise, storing the state of the differential protection before the test and recovering a compatible state after the test is useful if the test is used for signalling good operation.

The relay may be tripped by a direct command from the trip relay via the processing unit. In the embodiment of FIG. 3, an output D2 of the processing unit is connected to a module 38 for controlling the charging of the capacitor 32 also used to store electrical energy for controlling the trip relay 12. Tripping is then performed indirectly by way of the capacitor 32, the comparator 33 and the thyristor 34.

Thus, an electrical protection unit according to one embodiment of the invention includes main contacts 3, a mechanism 6 for opening said main contacts 3, main conductors connected in series with said main contacts and a differential protection device having at least two differential protection chains as defined above.

Figure 4A:
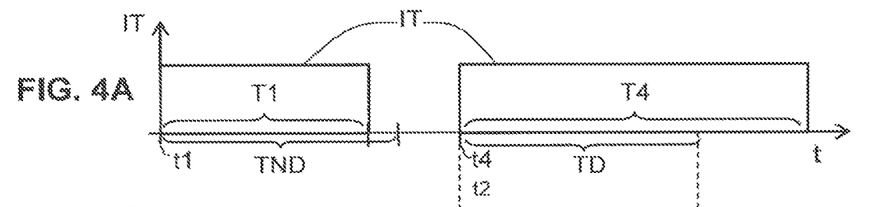
FIGS. 4A to 4D show timing diagrams of signals in a differential protection device according to embodiments of the invention.
Figure 4B:
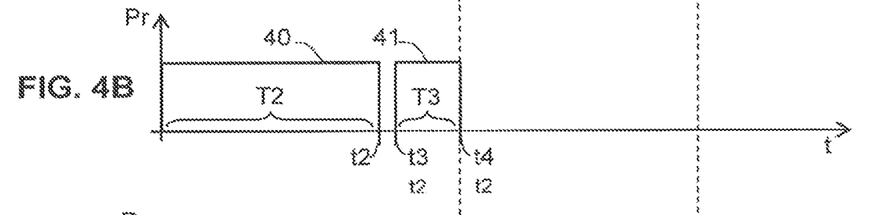
Figure 4C:
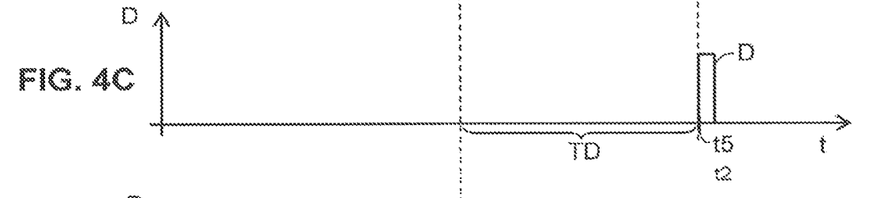
Figure 4D:
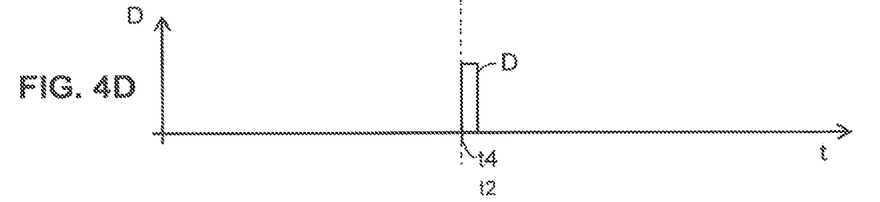

FIGS. 4A to 4D show timing diagrams of signals in a differential protection device according to embodiments of the invention. In FIG. 4A, at the time t1, a test signal ST is controlled for a duration T1 smaller than a no-trip time TND. In FIG. 4B, initial processing of the signals of the protection chains is performed in particular at the start and at the end of a time T2. For example, at the time t1, there is determination of the state of the protection chains before or at the start of the test and, at a time t2, determination of the state of the protection chains after the test signal by a processing operation 40. Analysis 41 of the state of the test for a duration T3 begins at a time t3, and, at a time t4, there is a decision to signal or to trip the opening of a unit. The tripping may be performed by way of the test signal by sending a test current for a time T4 greater than the trip time TD. The unit will trip through a protection chain at the end of a trip time TD at a time t5, as in FIG. 4C. In another embodiment, tripping may be performed directly via a command from the relay, as in FIG. 4D.

Figure 5:
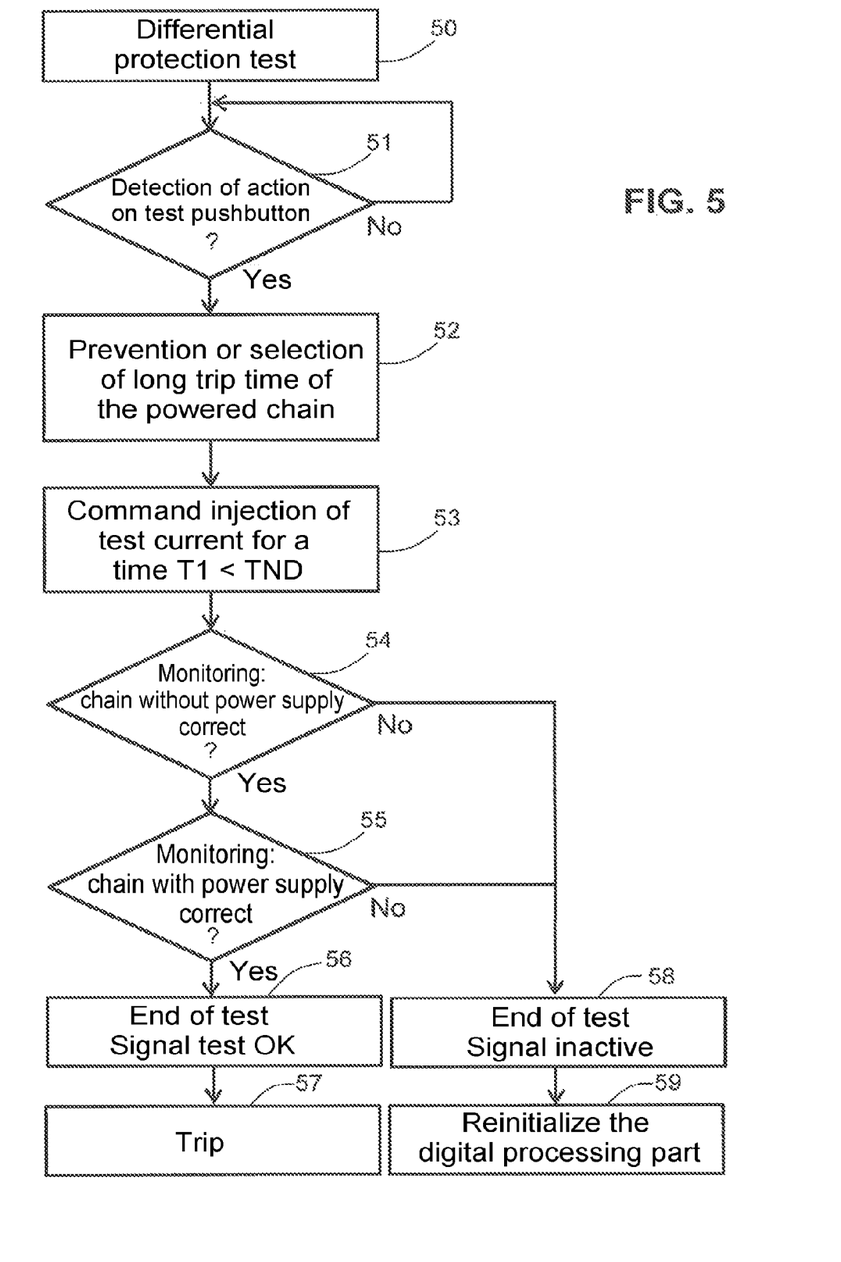
FIG. 5 shows a first differential protection test flow chart according to one embodiment of the invention.

FIG. 5 shows a first differential protection test flow chart according to one embodiment of the invention. The differential protection test method has a first differential protection chain 7, a second differential protection chain 8 and a processing unit 22. In a step 50, a test phase begins. When the test is intended to be manual, the method includes a step 51 of detecting action on a unit for controlling the test for launching a test cycle. The control unit is generally a pushbutton on the front face of a protection device or unit. To extend the no-trip time, the method includes a step 52 of preventing or of selecting long tripping of the second differential protection chain before the command to channel or to inject said test signal. To facilitate processing, said second differential protection chain requiring an electric power supply is associated with the processing unit for the processing functions. There is then a step 53 of controlling the flow of a current IT or of injecting a signal for testing the differential protection for a predetermined duration T1 smaller than a no-trip time TND of said first and of said second differential protection chains. After the flow of a test signal, a step 54 determines the state of said first differential protection chain and monitors the conformity of the operation of the protection. If the test is not good or not conclusive with regard to the first chain, the method moves to an initial processing of the end of the test for managing an incorrect test. If the monitoring of step 54 is good, a step 55 determines the state of said second differential protection chain and monitors the conformity of the operation of the protection. If the test is not good or not conclusive with regard to the second chain, the method moves to the initial processing of the end of the test for managing an incorrect test. If the monitoring of step 55 is good, this means that the two chains are operating correctly. The method moves to second processing of the end of the test for managing a good test. If the test is good, a step 56 signals the end of the test, in particular with an indicator light and/or a communication, and a step 57 brings about tripping of the opening of an electrical unit, also making it possible to test the mechanical part of the unit. If the test is incorrect or is not compliant, a step 58 signals the end of the test, in particular with an indicator light and/or a communication, and then a reinitialization step 59 reinitializes a digital part of the processing unit. In the flow chart of FIG. 5, steps 54 and 55 form the two grouped functions of determining the states of the differential protections and the two conformity monitoring operations. However, these functions may be performed in separate steps, one step for determining the states and one step for monitoring the conformity for each protection chain.

Figure 6:
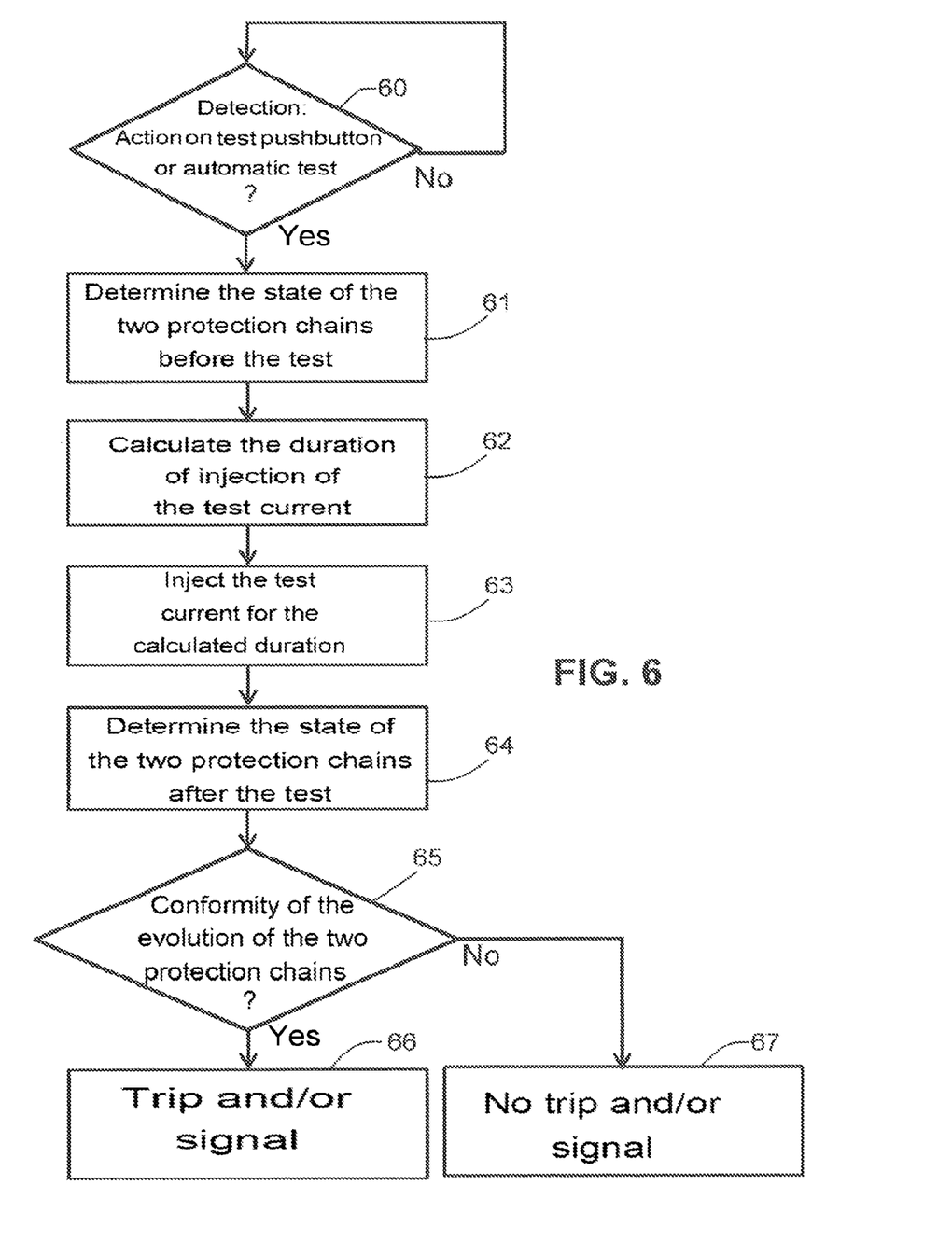
FIG. 6 shows a second differential protection test flow chart according to one embodiment of the invention.

FIG. 6 shows a second differential protection test flow chart according to one embodiment of the invention. In this flow chart, a step 60 detects an action on a pushbutton for launching a manual test or a periodic automatic test. A step 61 determines the state of the first and of the second differential protection chain before the flow of a test current or signal. A step 62 then calculates the duration of injection or flow of the test current. In this case, the duration depends on the initial state of the protection, in particular in the event of a fault current or residual leakage current. The flow time T1 of the test may be reduced in order to guarantee non-tripping of the unit during the test. In a step 63, the test current flows for the duration calculated beforehand. A step 64 then determines the state of the two differential protection chains after the flow of the test current. A step 65 determines the conformity of the evolution of the states of the two differential protection chains. If the test is good, a step 66 controls tripping of an electrical unit and/or the signalling of a correct test. If the test is incorrect or non-compliant, a step 67 controls the signalling of an incorrect test.

During the test phase, in particular in steps 54, 61 or 64, of determining the first processing chain, the method monitors a timing or filtering component 32 of said first differential protection chain not requiring an electric power supply.

The differential protection tests described above also apply to differential protections having more than two protection chains. The number of two chains is not a limit but an illustration of the preferred embodiments.

The embodiments described above show tripping of the test by manual action on a pushbutton. This action is used above all to bring about tripping of the opening of an electrical unit. However, the test may also be tripped periodically in an automatic manner. In this case, local or remote signalling will be preferred.

In the embodiments described above, the test is performed by generating a differential fault current by tapping off a current upstream and downstream of the current sensors. However, other types of test signal generation are possible, in particular the use of additional test windings in differential current sensors and/or with generators supplied with power and controlled by the processing unit.

The electrical unit shown in FIG. 1 is a bipolar unit with two phase and neutral lines. However, the invention also applies to bipolar or tripolar or tetrapolar units.

The invention claimed is:

1. A test method for testing differential protection having a first differential protection chain, a second differential protection chain, and processing circuitry, the method comprising:
controlling a simultaneous test of both of the first and second differential protection chains, the test being initialed by a flow of a test current or a test signal for testing a differential protection, for a predetermined duration smaller than a no-trip time of the first and second differential protection chains,
determining a state of the first and second differential protection chains after the flow of test current or the test signal,
monitoring a conformity of an evolution of the first and second differential protection chains,
determining a state of the test, and
tripping or signalling when the state of the test is determined to be satisfactory.

2. The test method according to claim 1, further comprising, during a test phase:
determining the state of the first and second differential protection chains before the flow of the test current or the test signal, and
calculating a duration of an injection of the test current or the test signal based on a result of the determination of the state of the first and second differential protection chains.

3. The test method according to claim 2, wherein:
the second differential protection chain requires an electric power supply and is associated with the processing circuitry, and
the method further comprises, during the test phase, preventing or selecting long tripping of the second differential protection chain before a command to channel or to inject the test current or the test signal.

4. The test method according to claim 1, wherein, in determining the state of the first differential processing chain, the method includes monitoring a timing or filtering component of the first differential protection chain, which does not require an electric power supply.

5. The test method according to claim 1, further comprising detecting action on a unit to control the test, to one of manually launch a test cycle and automatically launch the test cycle periodically.

6. The test method according to claim 1, further comprising reinitializing a digital part of the processing circuitry when the state of the test is determined to be not compliant.

7. A differential protection device, comprising:
a first differential protection chain,
a second differential protection chain, a test device to test the first and second differential protection chains, and processing circuitry connected to modules of the second differential protection chain to receive a signal representative of processing of the second differential protection chain, wherein the processing circuitry:
- is further connected to the first differential protection chain to receive a signal representative of a differential protection and to determine a state of protection of the first differential protection chain,
- includes a single output to control a simultaneous test of both of the first and second differential protection chains, the test being initiated by a flow of a test current or a test signal to the test device for a predetermined duration smaller than a no-trip time of the first and second differential protection chains,
- is configured to monitor an, evolution of both of the first and second protection chains to determine a state of the test, and
- is configured to control tripping an opening of an electrical unit or signaling, when a result of the test is determined to be satisfactory.

8. The differential protection device according to claim 7, wherein the processing circuitry is further configured to determine the state of the first differential protection chain and a state of the second differential protection chain before the flow of the test current or the test signal, and control the test device based on the states of the first and second differential protection chains.

9. The differential protection device according to claim 7, wherein the first differential protection chain is a chain operating with an AC or a pulsed fault current not requiring an electric power supply to operate.

10. The differential protection device according to claim 7, wherein the second differential protection chain operates for a DC, an AC or a pulsed fault current and is supplied with power by an electric power supply, the processing circuitry being associated with the second differential protection chain to process the differential protection.

11. The differential protection device according to claim 7, wherein the first differential protection chain includes a timing or filtering component, the timing or filtering component being connected to the processing circuitry to supply a signal representative of the state of the first differential protection chain.

12. The differential protection device according to claim 7, further comprising a unit to control the test, the unit being connected to the processing circuitry to manually control a test cycle.

13. The differential protection device according to claim 7, wherein the opening of a unit is tripped by a command for a test current flow time that is greater than a trip time of the first differential protection chain or of the second differential protection chain.

14. The test device according to claim 7, wherein the opening of a unit is tripped by a direct command from a trip relay via the processing circuitry or via an output of the processing circuitry controlling a charging of a capacitor also used to store electrical energy to control the trip relay.

15. An electrical protection device, comprising:
main contacts,
a mechanism to open the main contacts,
main conductors connected in series with the main contacts, and
the differential protection device of claim 7,
further comprising current sensors for the first and second differential protection chains surrounding the main conductors and supplying signals representative of differential fault currents, the opening mechanism being actuated by a trip relay in an event of detection of a differential fault or of a conclusive test of the first and second differential protection chains.

16. The test method of claim 1, further comprising:
determining the state of the first and second differential protection chains prior to the flow of the test current or the test signal, and analyzing the state of the test during a period following the flow of the test current or the test signal for the predetermined duration.

* * * * *